United States Patent
Yamada

(10) Patent No.: US 8,053,953 B2
(45) Date of Patent: Nov. 8, 2011

(54) ELECTRONIC COMPONENT FOR SURFACE MOUNTING

(75) Inventor: Hiroaki Yamada, Saitama (JP)

(73) Assignee: Nihon Dempa Kogyo Co., Ltd. (JP)

( * ) Notice: Subject to any disclaimer, the term of this patent is extended or adjusted under 35 U.S.C. 154(b) by 133 days.

(21) Appl. No.: 12/514,278

(22) PCT Filed: Nov. 8, 2007

(86) PCT No.: PCT/JP2007/071685
§ 371 (c)(1),
(2), (4) Date: May 8, 2009

(87) PCT Pub. No.: WO2008/056725
PCT Pub. Date: May 15, 2008

(65) Prior Publication Data
US 2010/0060108 A1    Mar. 11, 2010

(30) Foreign Application Priority Data
Nov. 8, 2006    (JP) ................... 2006-302258

(51) Int. Cl.
*H01L 41/053* (2006.01)
(52) U.S. Cl. ............................................. 310/348
(58) Field of Classification Search ............ 310/340, 310/344, 348
See application file for complete search history.

(56) References Cited

U.S. PATENT DOCUMENTS

| | | | | |
|---|---|---|---|---|
| 5,841,217 A | * | 11/1998 | Kizaki et al. | 310/348 |
| 2005/0269911 A1 | * | 12/2005 | Usuda | 310/348 |
| 2007/0145863 A1 | * | 6/2007 | Kusai | 310/348 |

FOREIGN PATENT DOCUMENTS

| | | |
|---|---|---|
| JP | 5-90954 U | 12/1993 |
| JP | 2003-297453 A | 10/2003 |
| JP | 2005-268580 A | 9/2005 |
| JP | 2006-32645 A | 2/2006 |
| JP | 2006-42096 A | 2/2006 |
| WO | WO2005/109638 | * 11/2005 |

OTHER PUBLICATIONS

Kazuhiro Igarashi et al., "Analysis of Solder Joint Breakdown Life in Electronic Devices Mounted in Cars", Toyota Technical Review, vol. 54 No. 1, Aug. 2005, pp. 142-143 with English Abstract.
International Search Report for International Patent Application No. PCT/JP2007/071685 mailed Dec. 11, 2007 with English Translation.
European Search Report for Application No. 07831416.8-1232/2091078 mailed Feb. 19, 2010.

* cited by examiner

*Primary Examiner* — Derek Rosenau
(74) *Attorney, Agent, or Firm* — Cantor Colburn LLP

(57) ABSTRACT

An electronic component, which is surface-mounted on a wiring board by soldering, and in which the occurrence of cracks in the solder after surface-mounting is suppressed, may include: a member constituting at least part of a container and made of ceramic; and an external terminal provided on the outer surface of the member and used in surface-mounting the electronic component on the wiring board by solder. The film thickness of a layer constituting the external terminal is designed so that when the thermal expansion coefficient of the ceramic constituting the member is $\alpha_1$, combined expansion coefficient $\alpha_k$ of the member and the external terminal satisfies a relation of $1.029 \leq \alpha_k/\alpha_1 \leq 1.216$. The external terminal preferably comprises a nickel layer as an electrode body.

12 Claims, 3 Drawing Sheets

US 8,053,953 B2

ELECTRONIC COMPONENT FOR SURFACE MOUNTING

CROSS REFERENCE TO RELATED APPLICATIONS

This is a U.S. national stage of application No. PCT/JP2007/071685, filed on 8 Nov. 2007. Priority under 35 U.S.C. §119(a) and 35 U.S.C. §365(b) is claimed from Japanese Application No. 2006-302258, filed 8 Nov. 2006, the disclosure of which is also incorporated herein by reference.

TECHNICAL FIELD

The present invention relates to a surface-mount electronic component such as a quartz crystal unit, and particularly to an electronic component that can maintain a good bonding state to a wiring board on which the electronic component is mounted.

BACKGROUND ART

With the miniaturization of electronic equipment, electronic components mounted on printed wiring boards and the like in the electronic equipment have also been miniaturized, and surface-mount type electronic components have been widely used. Examples of the surface-mount type electronic components include various quartz crystal devices in which at least a quartz crystal blank is housed in a container for surface mounting. Such crystal devices include: crystal units in which a crystal blank is hermetically enclosed in a container; and crystal oscillators in which a crystal blank is hermetically enclosed in a container, and an IC chip (integrated circuit chip) in which an electronic circuit, such as an oscillation circuit using the crystal blank, is integrated is housed in the container. The surface-mount type crystal units and crystal oscillators have small size and light weight, so that they are included as frequency and time reference sources, particularly in portable electronic equipment.

In the surface-mount type crystal devices, the crystal blank should be piezoelectrically vibrated in a state cut off from the ambient air, so that a configuration is often used in which using a container made of ceramic, the crystal blank is held and hermetically enclosed in a recess formed in such a container. The crystal device in which the crystal blank is hermetically enclosed in the container made of ceramic in such a manner is surface-mounted on a wiring board by, for example, reflow soldering.

However, with the miniaturization of the surface-mount type crystal devices, the volume of solder in the bonding portion between the crystal device and the wiring board also decreases, and stress due to the difference between the thermal expansion coefficient of the container made of ceramic in the crystal device and the thermal expansion coefficient of the wiring board is concentrated in the solder in the bonding portion, so that cracks may occur in the solder.

FIGS. 1A to 1C show a general surface-mount type crystal unit. FIG. 1A is a cross-sectional view of the crystal unit mounted on a wiring board, FIG. 1B is a bottom view of the crystal unit, and FIG. 1C is a partly enlarged cross-sectional view showing the configuration of a mounting terminal in the crystal unit.

In the crystal unit shown in the figures, crystal blank 2 is housed in surface-mount type container body 1, and metal cover 3 is placed over container body 1 to hermetically enclose crystal blank 2 in the container. Container body 1 has a generally rectangular planar contour, that is, a flat, generally rectangular parallelepiped-shaped contour, which is seen as a rectangle as seen from above when container body 1 is mounted on a wiring board. A recess for housing crystal blank 2 is formed on the upper surface of container body 1. Such a container body is constituted of laminated ceramic so as to have generally rectangular bottom wall layer 1a, and frame wall layer 1b that is formed in a frame shape by providing a generally rectangular opening, and is laminated on bottom wall layer 1a. A pair of crystal holding terminals 4 are provided on the inner bottom surface of the recess in the vicinity of positions at both ends of one side of the inner bottom surface respectively. Crystal holding terminals 4 are used for electrically and mechanically holding crystal blank 2 in the recess, as described later.

External terminal 6 as the mounting terminal used in mounting container body 1 on a wiring board is provided in four corner portions on the outer bottom surface of container body 1, that is, the surface that faces the wiring board when container body 1 is mounted on the wiring board. External terminal 6 is formed as a conductive layer having a generally rectangular planar shape. Part of external terminal 6 is provided as a side electrode, extending to a side surface of container body 1. Of these four external terminals 6, a pair of external terminals 6 positioned at both ends of one diagonal in the outer bottom surface of container body 1 are electrically connected to the pair of crystal holding terminals 4 via conductive paths formed on the side surfaces of container body 1 and the lamination plane in the laminated ceramic. The remaining two external terminals 6 are used as ground terminals.

Crystal blank 2 is made of, for example, a generally rectangular AT-cut quartz crystal blank, and excitation electrodes 7 are formed on both major surfaces, respectively, as shown in FIG. 2. Extraction electrodes 8 are extended from the pair of excitation electrodes 7 toward both sides of one end of crystal blank 2. At a position at an end of crystal blank 2, each extraction electrode 8 is formed to fold back between both major surfaces of crystal blank 2. Crystal blank 2 is fixed and held in recess 2 of container body 1 and is electrically and mechanically connected to container body 1 by fixing these extraction electrodes 8 to crystal holding terminals 4 respectively by, for example, conductive adhesive 9 or the like, at positions to which the pair of extraction electrodes 8 are extended.

A metal ring (not shown) is provided on the upper surface of container body 1 to surround the recess, and metal cover 3 is bonded to this metal ring by seam-welding or the like. The metal ring is electrically connected to external terminals 6 used as the ground terminals via through holes formed in container body 1.

External terminal 6 provided on the outer bottom surface of container body 1 is generally formed by laminating layers of tungsten (W), nickel (Ni), and gold (Au), in order, on the ceramic layer of container body 1, as shown in FIG. 1C. Different types of metals are laminated in this manner to constitute external terminal 6 in order to increase the bonding strength between the ceramic layer on container body 1 side and solder 10 used for bonding to wiring board 5. Here, tungsten is selected in terms of bonding strength to ceramic, nickel is selected to obtain properties required as the electrode body, and gold is selected in terms of adhesive strength to solder 10. The tungsten layer and the gold layer in external terminal 6 can be thinly formed as long as bonding strength or adhesive strength can be obtained.

Therefore, the thickness of external terminal 6 depends on the thickness of the nickel layer as the electrode body. In conventional crystal units, for example, the thickness of the nickel layer is about 0.003 to 0.009 mm (that is, 3 to 9 μm), while the thickness of the tungsten layer is about 1 μm, and the thickness of the gold layer is about 0.5 μm. When external terminal 6 is formed, in laminating ceramic green sheets, that is, unfired raw ceramic sheets, to form container body 1, the tungsten layer is provided on the ceramic green sheet forming container body 1 by a printing method and is finally formed by integrally firing with container body 1. Also, the nickel layer and the gold layer are formed by, for example, electrolytically plating the tungsten layer after firing.

The surface-mount type crystal unit configured in this manner is mounted on wiring board 5 of, for example, a glass-epoxy resin material, by reflow soldering. Specifically, circuit terminals 11 of copper (Cu), corresponding to external terminals 6 of the crystal unit, are previously provided on a surface of wiring board 5, and by bonding external terminals 6 to such circuit terminals 11 by reflow soldering, the crystal unit is surface-mounted on wiring board 5. At this time, solder 10 also climbs on the side portions of container body 1 to form the so-called solder fillets. By checking whether the solder fillets are properly formed, whether solder 10 melts during reflow soldering can be checked. When the solder fillets are not formed, it can be determined that reflow soldering is not suitably performed. Circuit terminals 11 are generally formed by patterning a copper (Cu) layer provided on the surface of circuit board 5.

DISCLOSURE OF THE INVENTION

Problems to be Solved by the Invention

However, in the surface-mount type electronic component having the above-described configuration, for example, the surface-mount type crystal unit shown in FIGS. 1A to 1C, when the electronic component is mounted on the wiring board by soldering, chips, cracks, and the like may occur in the solder as the fixing material to the wiring board, due to change over time, particularly when the temperature change during the period is large. It is considered that this is because the thermal expansion coefficient of the container body made of ceramic constituting the crystal unit is largely different from the thermal expansion coefficient of the solder and the wiring board. The thermal expansion coefficient as used herein is a linear thermal expansion coefficient with respect to temperature. For example, the thermal expansion coefficient of ceramic is, for example, about $7.6 \times 10^{-6}$ $K^{-1}$, while the thermal expansion coefficient of solder is $17 \times 10^{-6}$ $K^{-1}$, which is twice or more the thermal expansion coefficient of ceramic. When the temperature change is repeated in such a condition, nonlinear strain is accumulated in the solder, thereby, cracks and the like occur easily in the solder. Also, the thermal expansion coefficient of epoxy resin is $14 \times 10^{-6}$ $K^{-1}$, which is about the same as that of solder, so that the effect of the difference in thermal expansion coefficient between solder and the wiring board of a glass-epoxy resin material or the like is small.

Stress due to the difference in thermal expansion coefficient also occurs in the container body of ceramic, but generally, the nonlinear strain yield point of solder is lower than that of ceramic and the glass-epoxy resin material, so that the generation of cracks is concentrated in the solder.

It is an object of the present invention to provide an electronic component, particularly a crystal device, mounted on a wiring board by soldering, wherein the generation of cracks in the solder is prevented.

Means for Solving the Problems

The object of the present invention is achieved by a surface-mount type electronic component comprising: a member constituting at least part of a container and made of ceramic; and an external terminal provided on the outer surface of the member and used in surface-mounting the electronic component on a wiring board by solder, wherein when the thermal expansion coefficient of the ceramic constituting the member is $\alpha_1$, combined expansion coefficient $\alpha_k$ of the member and the external terminal satisfies a relation of $1.029 \leq \alpha_k/\alpha_1 \leq 1.216$.

In the present invention, the external terminal preferably comprises at least a nickel layer functioning as an electrode body. When the Young's modulus and thermal expansion coefficient of the ceramic constituting the member are $E_1$ and $\alpha_1$, and the Young's modulus and thermal expansion coefficient of nickel are $E_2$ and $\alpha_2$, and when the cross-sectional area of the member in a plane perpendicular to the bonding plane between the member and the external terminal is $A_1$, and the cross-sectional area of the nickel layer of the external terminal in the plane perpendicular to the bonding plane is $A_2$, the combined expansion coefficient $\alpha_k$ can be represented by the following formula (1):

$$\alpha_k = (E_1 \cdot \alpha_1 \cdot A_1 + E_2 \cdot \alpha_2 \cdot A_2)/(E_1 \cdot A_1 + E_2 \cdot A_2) \qquad (1).$$

Alternatively, when the thickness of the member is $h_1$, and the thickness of the nickel layer is $h_2$, the combined expansion coefficient $\alpha_k$ can be represented by the following formula (1'):

$$\alpha_k = (E_1 \cdot \alpha_1 \cdot h_1 + E_2 \cdot \alpha_2 \cdot h_2)/(E_1 \cdot h_1 + E_2 \cdot h_2) \qquad (1').$$

As one example of the electronic component according to the present invention, the thermal expansion coefficient $\alpha_1$ of the ceramic constituting the member is $7.6 \times 10^{-6}$ $K^{-1}$, the thickness of the member is 0.18 mm, and the thickness of the nickel layer is 0.01 mm or more and 0.1 mm or less.

One example of the electronic component according to the present invention includes a crystal device, for example, a crystal unit or a crystal oscillator, in which at least a crystal blank is hermetically enclosed in a container.

According to the present invention, the combined expansion coefficient $\alpha_x$ of the member made of ceramic constituting the container and the external terminal is larger than the thermal expansion coefficient of ceramic and is close to the thermal expansion coefficient of solder. As a result, even if temperature change is repeated after the electronic component according to the present invention is mounted on a wiring board by soldering or the like, nonlinear strain occurring in the solder used for mounting is small, therefore, the generation of cracks in the solder is prevented.

BEST MODE FOR CARRYING OUT THE INVENTION

Figure 1A:
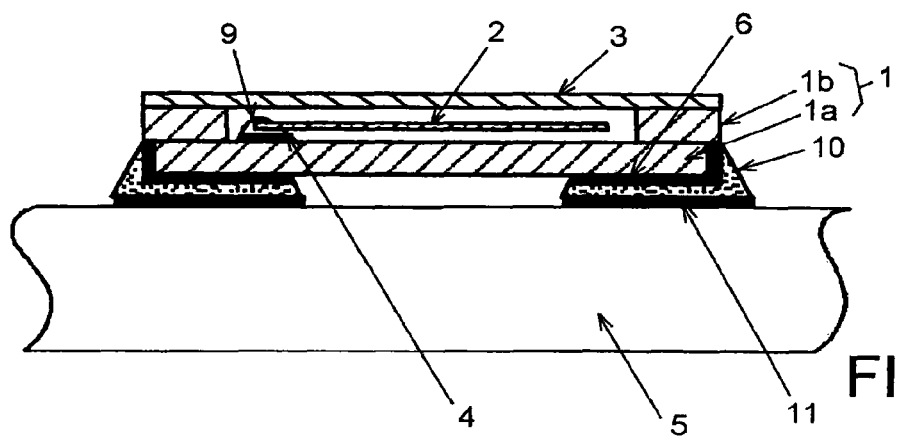
FIG. 1A is a cross-sectional view showing a surface-mount type crystal unit mounted on a wiring board.
Figure 1B:
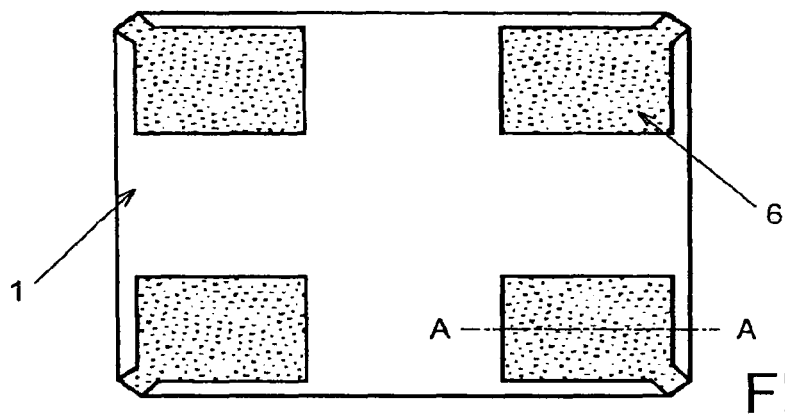
FIG. 1B is a bottom view of the crystal unit shown in FIG. 1A.
Figure 1C:
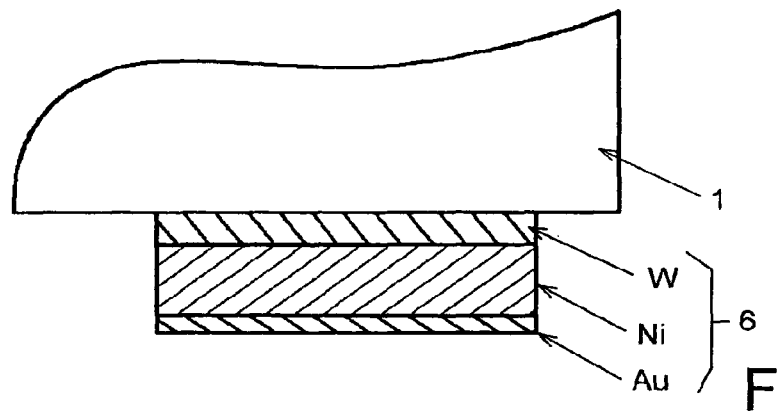
FIG. 1C is a partly enlarged cross-sectional view along line A-A in FIG. 1B.
Figure 2:
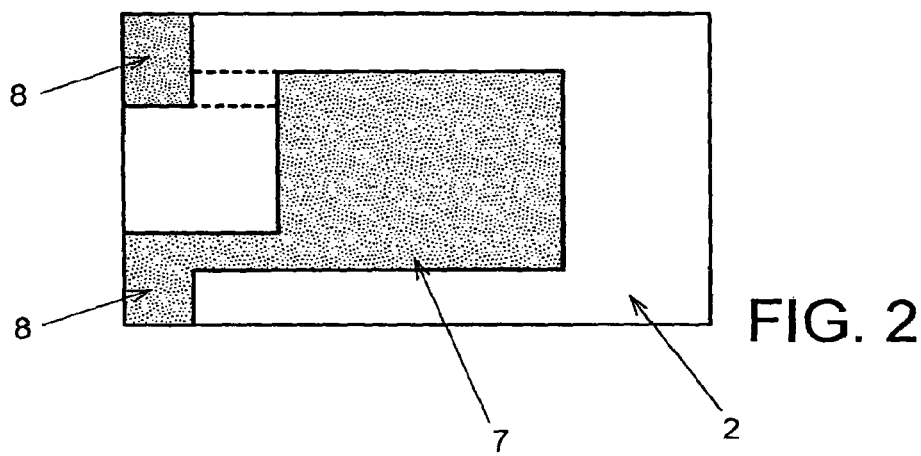
FIG. 2 is a plan view showing a general configuration of a crystal blank.
Figure 3:
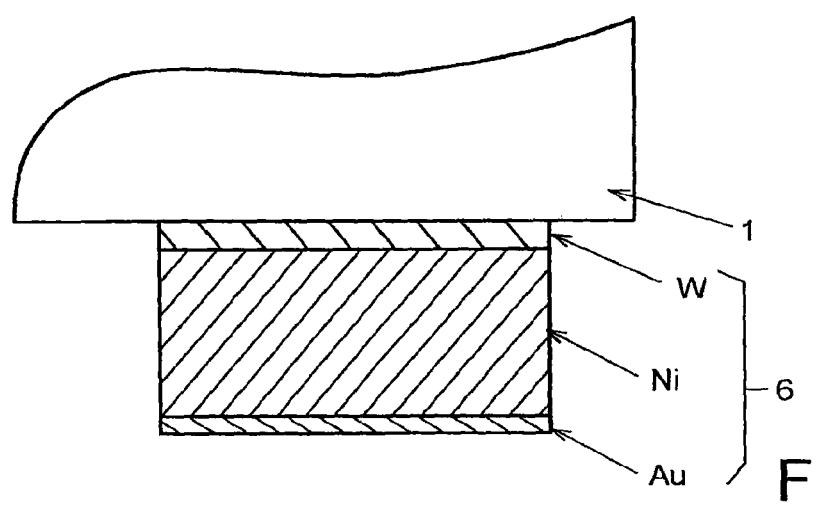
FIG. 3 is a partly enlarged cross-sectional view of a surface-mount type crystal unit according to an embodiment of the present invention.

Next, an embodiment of the present invention is described. Description is given below assuming that an electronic component according to the present invention is a surface-mount type crystal unit. The crystal unit in this embodiment is similar to that shown in FIGS. 1A to 1C, but it is different from that shown in FIGS. 1A to 1C in the configuration of external terminals 6 provided in four corner portions on the outer bottom surface of container body 1 respectively. FIG. 3 is a partly enlarged cross-sectional view of the crystal unit in this embodiment, showing such external terminal 6. In FIG. 3, components identical to those shown in FIGS. 1A to 1C are referred to by identical reference numerals, and redundant description is omitted.

The crystal unit uses container body 1 made of laminated ceramic and having a recess formed on one major surface, houses crystal blank 2 in the recess, and hermetically encapsulates crystal blank 2 in the recess by seam-welding flat-plate-shaped metal cover 3 to the open end surface of container body 1, as described above using FIG. 1A. The container in which crystal blank 2 is hermetically enclosed is constituted of container body 1 of ceramic and metal cover 3. A pair of crystal holding terminals 4 are provided on the inner bottom surface of the recess of container body 1, and by fixing both sides of one end of crystal blank 2, on which extraction electrodes 8 are extended from excitation electrodes 7, to crystal holding terminals 4, crystal blank 2 is held in the recess. External terminals 6 electrically connected to crystal holding terminals 4 and metal cover 3 are formed by laminating a tungsten (W) layer, and nickel (Ni) and gold (Au) layers, in this order, on the ceramic layer of container body 1, similarly to that described above. Therefore, for the thermal expansion coefficient and mechanical properties of external terminal 4, those of nickel can be used as they are. For the thickness of external terminal 6, the thickness of the nickel layer is dominant as described above. The nickel layer of the crystal unit in this embodiment is formed thicker than that of the conventional crystal unit shown in FIGS. 1A to 1C, as described later. The thickness of the tungsten layer is, for example, 2 μm or less, and preferably 1 μm or less. Also, the thickness of the gold layer is, for example, 0.3 μm to 0.7 μm or less.

Here, when two plate-shaped substances are bonded via the interface, the linear thermal expansion coefficient in the direction parallel to the interface when these two substances are seen as integral, that is, combined expansion coefficient $\alpha_k$, is generally represented by formula (1). Here, $E_1$, $\alpha_1$, and $A_1$ are the Young's modulus, thermal expansion coefficient, and cross-sectional area of one substance sandwiching the interface, respectively. Similarly, $E_2$, $\alpha_2$, and $A_2$ are the Young's modulus, thermal expansion coefficient, and cross-sectional area of the other substance, respectively.

$$\alpha_k = (E_1 \cdot \alpha_1 \cdot A_1 + E_2 \cdot \alpha_2 \cdot A_2)/(E_1 \cdot A_1 + E_2 \cdot A_2) \quad (1).$$

Here, the cross-sectional area is the cross-sectional area of each substance when each substance is cut in a plane perpendicular to the direction for which combined expansion coefficient $\alpha_k$ is defined. Considering that both substances share the bonding interface, the thickness of each substance can also be used, instead of the cross-sectional area of each substance. Specifically, when both substances have the same width, the same combined expansion coefficient $\alpha_k$ is obtained as well, even if the denominator and numerator of formula (1) are both divided by the common width. Therefore, the value of thickness can be used as it is, instead of the cross-sectional area.

Here, assuming that wiring board 5 of a glass-epoxy resin material is used and that circuit terminal 11 provided on a surface of wiring board 5 is composed of a copper layer, a case where the crystal unit in this embodiment is mounted on this wiring board 5 by reflow soldering is considered. At this time, the material constants of ceramic constituting container body 1, nickel (Ni) constituting the electrode body of external terminal 6, solder 10, the epoxy resin constituting wiring board 5, and copper (Cu) constituting circuit terminal 11 are as shown in Table 1. Here, solder 10 is the so-called lead (Pb)-free solder, and its composition is Sn (95.75% by weight)-Ag (3.5% by weight)-Cu (0.75% by weight).

TABLE 1

| | Ceramic | Ni | Solder | Epoxy resin | Cu |
|---|---|---|---|---|---|
| Young's modulus ($\times 10^9$ Pa) | 280 | 199.5 | 35.8 | 13 | 16.2 |
| Thermal expansion coefficient ($\times 10^{-6}$ K$^{-1}$) | 7.6 | 13.4 | 17 | 14 | 102.9 |

When the combined expansion coefficient $\alpha_x$ of container body 1 of ceramic and external terminal 6 using nickel as the electrode body, in the above-described crystal unit shown in FIGS. 1A to 1C, is obtained using the material constants shown in Table 1, it is $7.73 \times 10^{-6}$ K$^{-1}$. As described above, in formula (1), the thickness of each substance is used instead of the cross-sectional area. As the thickness of container body 1, the thickness of the bottom wall layer described above is used, and here, it is 0.18 mm. The thickness of the nickel layer constituting external terminal 6 is 0.006 mm. As a result, the combined expansion coefficient represented by formula (1) is $7.73 \times 10^{-6}$ K$^{-1}$, and this value is substantially the same as the thermal expansion coefficient of ceramic alone and is half or less of the thermal expansion coefficient of solder 10. Thus, it is understood that in the crystal unit shown in FIGS. 1A to 1C, due to the difference in thermal expansion coefficient, temperature change causes nonlinear strain in solder 10, and the effect of the accumulation of such nonlinear strain causes cracks in solder 10.

On the other hand, in wiring board 5 on which the surface-mount type crystal unit is mounted, the combined expansion coefficient of wiring board 5 of a glass-epoxy resin material and circuit terminal 11 of copper is $16.69 \times 10^{-6}$ K$^{-1}$. Here, the thickness of wiring board 5 is 1.6 mm, which is the thickness of a general wiring board, and the thickness of the copper layer constituting circuit terminal 11 is 0.04 mm. The combined expansion coefficient of wiring board 5 and circuit terminal 11 is about the same as the thermal expansion coefficient of solder 10, so that little stress occurs between wiring board 5 and solder 10 as described above, therefore, no nonlinear strain due to this stress occurs. The combined expansion coefficient of wiring board 5 and circuit terminal 11 can be excluded from the factors of the occurrence of cracks in solder 10.

The above leads to the fact that to prevent the generation of cracks in solder 10, the combined expansion coefficient of container body 1 of ceramic and the electrode body of nickel in external terminal 6 should be approximately the same as the thermal expansion coefficient of solder. In this case, the Young's modulus and thermal expansion coefficient of ceramic constituting container body 1 and the nickel layer constituting external terminal 6 are both constants. Therefore, to approximate combined expansion coefficient $\alpha_x$ to the thermal expansion coefficient of solder ($17 \times 10^{-6}$ K$^{-1}$), the thickness of the bottom wall layer of container body 1 should be decreased, and the thickness of the nickel layer of external terminal 6 should be increased instead.

In other words, when $E_1$, $\alpha_1$, and $A_1$ in formula (1) are the Young's modulus, thermal expansion coefficient, and cross-sectional area of the bottom wall layer of ceramic, and $E_2$, $\alpha_2$ and $A_2$ are the Young's modulus, thermal expansion coefficient, and cross-sectional area of the nickel layer of external terminal 6, the Young's modulus $E_1$ of ceramic ($=280 \times 10^9$ Pa) is significantly larger than the Young's modulus $E_2$ of solder ($=35.8 \times 10^9$ Pa), so that when the thickness that determines the cross-sectional area $A_1$ of ceramic is increased, combined expansion coefficient $\alpha_k$ remains small, depending on the material constant of ceramic. In other words, the thickness of the ceramic layer should be decreased, and the film thickness (that is, cross-sectional area $E_2$) of the nickel layer having thermal expansion coefficient $\alpha_2$ ($13.4 \times 10^{-6}$ K$^{-1}$) which is larger than the thermal expansion coefficient $\alpha_1$ of ceramic ($7.6 \times 10^{-6}$) should be increased. However, in container body 1, for reason in manufacturing, the bottom wall layer, which is a ceramic layer, needs to be a predetermined thickness. Then, in this embodiment, by using the thickness of the bottom wall layer of container body 1 similar to that of the case shown in FIGS. 1A to 1C, and increasing the film thickness of the nickel layer in external terminal 6, the combined expansion coefficient $\alpha_k$ of container body 1 and external terminal 6 is approximated to the thermal expansion coefficient of solder 10 ($17 \times 10^{-6}$ K$^{-1}$).

Figure 4:
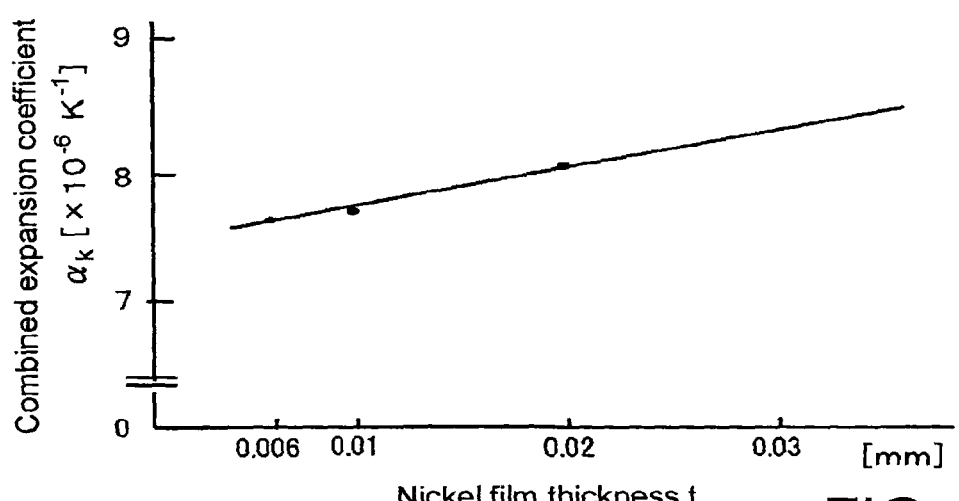
FIG. 4 is a graph showing change in the combined expansion coefficient $\alpha_x$ of the nickel layer and ceramic with respect to the film thickness t of the nickel layer.

Table 2 and FIG. 4 show change in the combined expansion coefficient $\alpha_k$ of the nickel layer and ceramic having a thickness of 0.18 mm with respect to the film thickness of the nickel layer when the nickel layer is bonded to the ceramic. Combined expansion coefficient $\alpha_k$ is calculated based on formula (1). From Table 2 and FIG. 4, it is seen that as the thickness of the nickel layer increases, combined expansion coefficient $\alpha_k$ increases.

TABLE 2

| Ni thickness (mm) | 0.006 | 0.010 | 0.020 | 0.050 | 0.1 |
|---|---|---|---|---|---|
| Combined expansion coefficient $\alpha_x$ ($\times 10^{-6}$ K$^{-1}$) | 7.73 | 7.82 | 8.03 | 8.56 | 9.24 |

Figure 5:
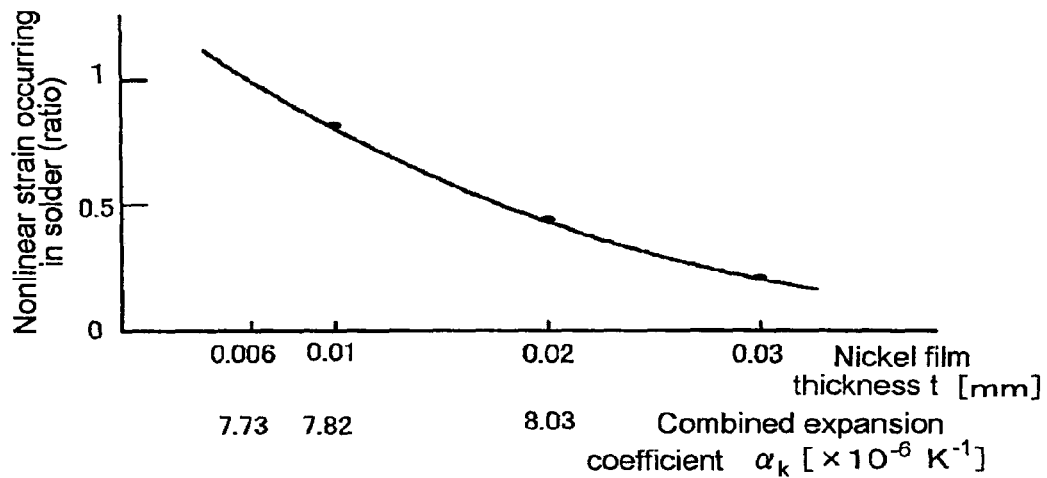
FIG. 5 is a graph showing the relation of nonlinear strain occurring in the solder with respect to the film thickness of the nickel layer and the combined expansion coefficient.

FIG. 5 is a graph showing nonlinear strain $\Delta\epsilon$ that occurs in the solder when temperature change is repeatedly applied, that is, when temperature cycles are applied, provided that the crystal unit is mounted on wiring board 5 by reflow soldering as described above. Nonlinear strain $\Delta\epsilon$ is obtained by a finite element method. In the graph of FIG. 5, the horizontal axis shows the film thickness t of the nickel layer, and corresponding combined expansion coefficient $\alpha_k$, and the vertical axis shows nonlinear strain by relative values in which nonlinear strain, when the film thickness of the nickel layer is 0.006 mm, is "1." Here, a process, in which the temperature is increased from low temperature ($-40°$ C.) to high temperature ($125°$ C.) and returned to the low temperature again, is one cycle, and such a temperature cycle is repeated for three cycles. In each cycle, the time required for the temperature change between low temperature and high temperature is 1 minute, and the time for maintaining the state of each of low temperature and high temperature is 4 minutes. In one cycle, nonlinear strain occurs in each of the temperature increasing process and the temperature decreasing process. Therefore, by assuming that nonlinear strain in a half cycle is $\Delta\epsilon$ and repeating the temperature cycle three times, $6\Delta\epsilon$ is obtained as the accumulated value of nonlinear strain. The value of $\Delta\epsilon$ obtained by dividing this accumulated value $6\Delta\epsilon$ by 6 is shown as the average value of nonlinear strain in a half cycle on the vertical axis in the graph of FIG. 5.

From the graph of FIG. 5, it is seen that as the film thickness t of the nickel layer in external terminal 5 increases, the combined expansion coefficient $\alpha_k$ of the nickel layer and the ceramic of the container body increases and approximates the thermal expansion coefficient of solder, so that nonlinear strain $\Delta\epsilon$ decreases.

Here, the relation between nonlinear strain occurring in solder 10 and the generation of cracks in solder 10 when temperature change occurs repeatedly is represented by the following formula (2), for example, as described in TOYOTA Technical Review, Vol. 54, No. 1, p. 143, August 2005.

$$N_f = 1000 \cdot (0.01/\Delta\epsilon)^2 \quad (2)$$

Here, $N_f$ is the number of temperature cycles required until cracks begin to occur in solder 10 after soldering, that is, the number of cycles for initial crack generation. Formula (2) shows that the number of cycles for initial crack generation is inversely proportional to the square of nonlinear strain, and shows that when the magnitude of nonlinear strain is half, the number of temperature cycles until crack generation is four times.

Figure 6:
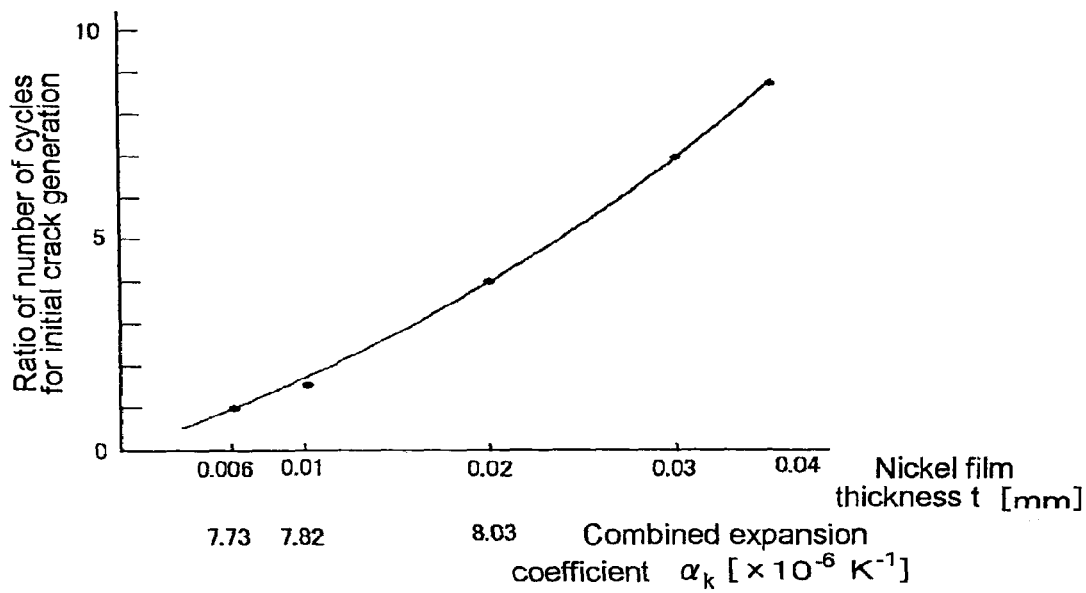
FIG. 6 is a graph showing the relation of the number of cycles for initial crack generation with respect to the film thickness of nickel and the combined expansion coefficient.

FIG. 6 is a graph obtained by substituting nonlinear strain $\Delta\epsilon$ shown in FIG. 5 into formula (2), showing the film thickness t of the nickel layer and combined expansion coefficient $\alpha_k$ as the horizontal axis, and the number of cycles for initial crack generation with respect to them as the vertical axis. However, the vertical axis does not show the actual value of the number of cycles for initial crack generation and is represented by a ratio normalized with the number of cycles for initial crack generation, when the nickel film thickness is 0.006 mm, being "1." Therefore, when the number of cycles for initial crack generation is 5 in FIG. 6, it means that cracks occur through the number of cycles five times the number of cycles for initial crack generation when the nickel film thickness is 0.006 mm.

From the graph shown in FIG. 6, it is seen that when the film thickness t of the nickel layer in external terminal 6 is about 0.003 to 0.009 mm as in the crystal unit shown in FIGS. 1A to 1C, the ratio of the number of cycles for initial crack generation is 1 to 1.5, and cracks occur in the solder at a relatively early stage when temperature cycles are applied. On the other hand, when the film thickness of the nickel layer is 0.01 mm or more, the ratio of the number of cycles for initial crack generation is more than 1.5, and with the increase in the film thickness of the nickel layer, the number of temperature cycles until crack generation increases. In the example shown in FIG. 6, the ratio of the number of cycles at crack generation is 4 when the film thickness of the nickel layer is 0.02 mm, is 7 when the film thickness is 0.03 mm, and is 10 when the film thickness is 0.04 mm.

In conventional crystal units, the film thickness of the nickel layer in the external terminal is about 0.003 to 0.009 mm because there is no technical idea of approximating the combined expansion coefficient of the container body and the external terminal to the thermal expansion coefficient of solder. On the other hand, according to the consideration of the present inventor described above, when the film thickness of the nickel layer in the external terminal is 0.01 mm or more, which is larger than conventional 0.009 mm, the generation of cracks in the solder can be reduced. As the film thickness of the nickel layer is increased, the number of temperature cycles until crack generation in the solder can be increased, but the thickness of the entire external terminal also increases, so that the height of the crystal unit also increases. Considering the space for component location in electronic equipment comprising the surface-mount type crystal unit, and the like, the height of the crystal unit itself cannot be too high, and due to the restriction, the film thickness of the nickel layer of the external terminal should be reduced to, for example, roughly 0.1 mm or less. Although not shown in the graph of FIG. 6, when the film thickness of the nickel layer is 0.1 mm, the ratio of the number of cycles for initial crack generation is roughly 30.

When the thermal expansion coefficient $\alpha_1$ of ceramic constituting container body 1 is $7.6 \times 10^{-6} K^{-1}$, and the film thickness t of the nickel layer in external terminal 6 is 0.01 to 0.1 mm, the combined expansion coefficient $\alpha_k$ of the external terminal and the container body is $7.82 \times 10^{-6}$ to $9.24 \times 10^{-6}$ $K^{-1}$, and this combined expansion coefficient $\alpha_k$ is 102.9 to 121.6% of the intrinsic thermal expansion coefficient $\alpha_1$ of ceramic. The thermal expansion coefficient $\alpha_1$ of ceramic changes to some extent, depending on the composition of ceramic, and the like, but according to the consideration of the present inventor, when ratio $\alpha_k/\alpha_1$ is in the range of $1.029 \leq \alpha_k/\alpha_1 \leq 1.216$, the occurrence of cracks in the solder caused by the concentration of stress in the solder due to a difference in thermal expansion coefficient can be effectively suppressed.

In the above description, when the Young's modulus, expansion coefficient, and cross-sectional area of ceramic used for container body 1 are $E_1$, $\alpha_1$, and $A_1$ respectively, and the Young's modulus, expansion coefficient, and cross-sectional area of nickel are $E_2$, $\alpha_2$, and $A_2$ respectively, combined expansion coefficient $\alpha_k$ is defined as the following formula (1).

$$\alpha_k = (E_1 \cdot \alpha_1 \cdot A_1 + E_2 \cdot \alpha_2 \cdot A_2)/(E_1 \cdot A_1 + E_2 \cdot A_2) \quad (1).$$

However, thickness may be used instead of cross-sectional area, as described above. In other words, when the thickness of the bottom wall layer in container body 1 made of ceramic is $h_1$, and the thickness of the nickel layer in external terminal 6 is $h_2$, combined expansion coefficient $\alpha_k$ may be defined by the following formula (1').

$$\alpha_k = (E_1 \cdot \alpha_1 \cdot h_1 + E_2 \cdot \alpha_2 \cdot h_2)/(E_1 \cdot h_1 + E_2 \cdot h_2) \quad (1').$$

Even if combined expansion coefficient $\alpha_k$ defined by thickness as shown in formula (1') is used, the generation of cracks in the solder caused by the concentration of stress in the solder due to a difference in thermal expansion coefficient can be effectively suppressed, when ratio $\alpha_k/\alpha_1$ is in the range of $1.029 \leq \alpha_k/\alpha_1 \leq 1.216$.

In the crystal unit described above, by using container body 1 made of ceramic and having a recess formed, housing crystal blank 2 in the recess, and placing flat-plate-shaped metal cover 3 over the recess, crystal blank 2 is hermetically enclosed in the recess, but the configuration of the crystal unit to which the present invention is applied is not limited to this. For example, a configuration may be used in which by using a plate-shaped member made of ceramic, and a concavely formed cover made of, for example, metal, fixing a crystal blank to the plate-shaped member, and then bonding the cover to the plate-shaped member to hermetically enclose the crystal blank in a space formed by the plate-shaped member and the cover. In this case, the container in which the crystal blank is hermetically enclosed is formed by the plate-shaped member of ceramic and the concavely formed cover. External terminals are formed as described above, in four corner portions on the major surface to which the crystal blank is not bonded, of two major surfaces of the plate-shaped member.

In this manner, in this embodiment, in an electronic component using a container at least part of which is made of a member made of ceramic, wherein external terminals for surface-mounting the electronic component to a wiring board by soldering are formed on the outer surface of the member made of ceramic, the configuration of the external terminal is determined so that the combined expansion coefficient $\alpha_k$ of the external terminal and the member made of ceramic approximates the thermal expansion coefficient of solder. Specifically, the configuration of the external terminal, particularly, the thickness of the nickel layer as the electrode body, is set so that when the thermal expansion coefficient of ceramic constituting the member on which the external terminals are provided is $\alpha_1$, combined expansion coefficient $\alpha_x$ satisfies a relation of $1.029 \leq \alpha_k/\alpha_1 \leq 1.216$.

The surface-mount type electronic component according to the present invention has been described above using the surface-mount type crystal unit as an example, however, of course, the present invention can be applied to various electronic components other than surface-mount type crystal units. For example, the present invention can also be applied to surface-mount type crystal oscillators in which a crystal blank and an IC chip in which an oscillation circuit using this crystal blank is integrated are housed in a surface-mount type container. The present invention can be applied not only to crystal units and crystal oscillators, but also to crystal devices in which a crystal blank is hermetically enclosed in a container made of ceramic. Further, the present invention can also be applied to electronic components other than crystal devices.

Figure 7:
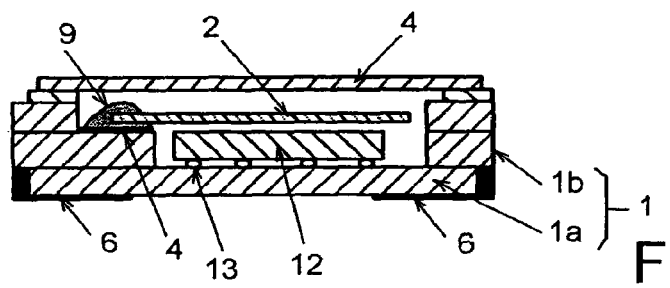
FIG. 7 is a cross-sectional view showing one example of a surface-mount type crystal oscillator.

FIG. 7 shows one example of the configuration of a surface-mount type crystal oscillator to which the present invention is applied.

The crystal oscillator shown in FIG. 7 is obtained by increasing the depth of the recess formed in the container body in the crystal unit described above, forming a step portion on the inner wall of the recess, locating crystal holding terminals 4 on the upper surface of this step portion, fixing crystal blank 2 to them, and fixing IC chip 12 onto the bottom surface of the recess. Such container body 1 has a structure in which two ceramic layers having different opening sizes are sequentially laminated as frame wall layer 1b on generally rectangular plate-shaped bottom wall layer 1a. A plurality of connection terminals electrically connected to external terminals 6 and crystal holding terminals 4 are formed as an electrode layer on the bottom surface of the recess of container body 1. In this crystal oscillator, crystal holding terminals 4 are not directly electrically connected to external terminals 6.

In IC chip 12, an electronic circuit comprising at least an oscillation circuit using crystal blank 2 is integrated in a semiconductor substrate. A plurality of IC terminals connected to the electronic circuit inside the IC chip are formed on a surface of IC chip 12. By bonding the IC terminals of IC chip 12 to the connection terminals by ultrasonic thermocompression bonding using bumps 13, IC chip 12 is fixed to the bottom surface of the recess of the container body, and the electronic circuit in IC chip 12 is electrically connected to crystal blank 2 and external terminals 6.

External terminals 6 in this crystal oscillator are provided in four corner portions on the outer bottom surface of container body 1 respectively, similarly to those shown in FIG. 1B. Four external terminals 6 include, for example, a power supply terminal, a ground terminal, an oscillation output terminal, and an AFC terminal. The power supply terminal and the ground terminal are used for supplying power supply voltage to IC chip 12. Output from the oscillation circuit in IC chip 12 appears in the oscillation output terminal. The AFC terminal is used for supplying an AFC (automatic frequency control) signal to the oscillation circuit.

External terminal 6 is similar to that shown in FIG. 3. In external terminal 6, a tungsten layer, a nickel layer, and a gold layer are laminated, and by increasing the thickness of the nickel layer to approximate the combined expansion coefficient of the container body and the external terminal to the thermal expansion coefficient of solder, the occurrence of cracks in the solder, when the crystal oscillator is mounted on a wiring board by reflow soldering, is suppressed.

The invention claimed is:

1. A surface-mount type electronic component comprising:
a member constituting at least part of a container and made of ceramic; and
an external terminal provided on an outer surface of the member and used in surface-mounting the electronic component on a wiring board by solder;
wherein when a thermal expansion coefficient of the ceramic constituting the member is $\alpha_1$, a combined expansion coefficient $\alpha_k$ of the member and the external terminal satisfies a relation of $1.039 \leq \alpha_k/\alpha_1 \leq 1.216$; and
wherein the external terminal comprises at least a nickel layer functioning as an electrode body, and when a Young's modulus and thermal expansion coefficient of the ceramic constituting the member are $E_1$ and $\alpha_1$, a Young's modulus and thermal expansion coefficient of nickel are $E_2$ and $\alpha_2$, a cross-sectional area of the member in a plane perpendicular to a bonding plane between the member and the external terminal is $A_1$, and a cross-sectional area of the nickel layer of the external terminal in the plane perpendicular to the bonding plane is $A_2$, the combined expansion coefficient $\alpha_k$ is represented by the following formula (1):

$$\alpha_k = (E_1 \cdot \alpha_1 \cdot A_1 + E_2 \cdot \alpha_2 \cdot A_2)/(E_1 \cdot A_1 + E_2 \cdot A_2) \quad (1);$$

and the thickness of the nickel layer excesses 0.02 mm and is 0.1 mm or less.

2. The electronic component according to claim 1, wherein the electronic component is a crystal device in which at least a crystal blank is hermetically enclosed in the container.

3. The electronic component according to claim 1, wherein the member comprises one major surface on which the external terminal is formed, and the other major surface on which a recess housing the crystal blank is formed, and by bonding a metal cover to an open end surface of the recess, the crystal blank is hermetically enclosed in the recess, the electronic component being configured as a crystal device.

4. The electronic component according to claim 1, wherein the thermal expansion coefficient $\alpha_1$ of the ceramic constituting the member is $7.6 \times 10^{-6}$ K$^{-1}$, the thickness of the member is 0.18 mm.

5. The electronic component according to claim 4, wherein the electronic component is a crystal device in which at least a crystal blank is hermetically enclosed in the container.

6. The electronic component according to claim 1, wherein the external terminal has a laminated structure comprising a tungsten layer provided in contact with the member, the nickel layer formed on the tungsten layer, and a gold layer formed on the nickel layer.

7. A surface-mount type electronic component comprising:
a member constituting at least part of a container and made of ceramic; and
an external terminal provided on an outer surface of the member and used in surface-mounting the electronic component on a wiring board by solder;
wherein when a thermal expansion coefficient of the ceramic constituting the member is $\alpha_1$, a combined expansion coefficient $\alpha_k$ of the member and the external terminal satisfies a relation of $1.039 \leq \alpha_k/\alpha_1 \leq 1.216$; and
wherein the external terminal comprises at least a nickel layer functioning as an electrode body, and when a Young's modulus and thermal expansion coefficient of the ceramic constituting the member are $E_1$ and $\alpha_1$, a Young's modulus and thermal expansion coefficient of nickel are $E_2$ and $\alpha_2$, a thickness of the member is $h_1$, and a thickness of the nickel layer is $h_2$, the combined expansion coefficient $\alpha_k$ is represented by the following formula (1');

$$\alpha_k = (E_1 \cdot \alpha_1 \cdot h_1 + E_2 \cdot \alpha_2 \cdot h_2)/(E_1 \cdot h_1 + E_2 \cdot h_2) \quad (1').$$

and the thickness of the nickel layer excesses 0.02 mm and is 0.1 mm or less.

8. The electronic component according to claim 7, wherein the electronic component is a crystal device in which at least a crystal blank is hermetically enclosed in the container.

9. The electronic component according to claim 7, wherein the member comprises one major surface on which the external terminal is formed, and the other major surface on which a recess housing the crystal blank is formed, and by bonding a metal cover to an open end surface of the recess, the crystal blank is hermetically enclosed in the recess, the electronic component being configured as a crystal device.

10. The electronic component according to claim 7, wherein the thermal expansion coefficient a1 of the ceramic constituting the member is $7.6 \times 10^{-6}$ K$^{-1}$, the thickness of the member is 0.18 mm.

11. The electronic component according to claim 10, wherein the electronic component is a crystal device in which at least a crystal blank is hermetically enclosed in the container.

12. The electronic component according to claim 7, wherein the external terminal has a laminated structure comprising a tungsten layer provided in contact with the member, the nickel layer formed on the tungsten layer, and a gold layer formed on the nickel layer.

* * * * *